United States Patent
Kannegundla et al.

(10) Patent No.: US 6,184,928 B1
(45) Date of Patent: Feb. 6, 2001

(54) METHOD AND APPARATUS FOR SPLIT SHIFT REGISTER ADDRESSING

(75) Inventors: Ram Kannegundla, Rochester; Timothy J. Kenney, Sr., Pittsford; Robert M. Guidash, Rush, all of NY (US)

(73) Assignee: Eastman Kodak Company, Rochester, NY (US)

( * ) Notice: Under 35 U.S.C. 154(b), the term of this patent shall be extended for 0 days.

(21) Appl. No.: 08/846,392

(22) Filed: Apr. 30, 1997

(51) Int. Cl.$^7$ .................................................. H04N 3/14
(52) U.S. Cl. .............................................. 348/294; 348/319
(58) Field of Search .................................. 348/294, 303, 348/312, 304, 317, 319, 320, 321, 314; 377/54, 77, 16

(56) References Cited

U.S. PATENT DOCUMENTS

| | | |
|---|---|---|
| 3,801,964 | 4/1974 | Palfi et al. . |
| 4,074,142 | 2/1978 | Jackson . |
| 4,099,162 | 7/1978 | von Basse . |
| 4,272,832 | 6/1981 | Ito . |
| 4,539,598 | 9/1985 | Dietrich et al. ............ 358/213 |
| 4,797,560 | 1/1989 | Berger et al. . |
| 4,797,562 * | 1/1989 | Dietrich .................... 348/304 |
| 4,841,369 * | 6/1989 | Nishizawa et al. ............ 348/304 |
| 4,849,942 | 7/1989 | Farrugia . |
| 4,860,004 | 8/1989 | Davis . |
| 4,897,818 | 1/1990 | Redwine et al. . |
| 5,027,226 | 6/1991 | Nagata et al. ............... 358/482 |
| 5,126,970 | 6/1992 | Haq . |
| 5,134,488 * | 7/1992 | Sauer ...................... 348/294 |
| 5,159,572 | 10/1992 | Morton . |
| 5,201,055 | 4/1993 | Izqierdo et al. . |
| 5,210,717 | 5/1993 | Tamaki . |
| 5,220,518 | 6/1993 | Haq . |
| 5,347,523 | 9/1994 | Khatri et al. . |
| 5,396,608 | 3/1995 | Garde . |
| 5,436,662 * | 7/1995 | Nagasaki et al. ............ 348/294 |
| 5,457,655 | 10/1995 | Savignac et al. . |
| 5,522,059 | 5/1996 | Marushima et al. . |
| 5,581,509 | 12/1996 | Golla et al. . |
| 5,877,808 * | 3/1999 | Iizuka .................... 348/312 |

FOREIGN PATENT DOCUMENTS

| | | | |
|---|---|---|---|
| 196 04 786 C1 | 6/1997 | (DE) | ............... G11C/8/04 |
| 0 743 649 A2 | 11/1996 | (EP) . | |

* cited by examiner

Primary Examiner—Wendy Garber
Assistant Examiner—Luong Nguyen
(74) Attorney, Agent, or Firm—James D. Leimbach

(57) ABSTRACT

An addressing circuit designed for implementation within the device being addressed that uses less silicon space by selecting the desired address with shift register outputs. A fast shift register is coupled to a slow shift register by a combinatorial circuit having inputs from the fast shift register and the slow shift register to providing the selected address. A timing circuit is electrically coupled to each the fast shift register and the slow shift register. A mode select circuit that is operatively coupled to at least one of either the fast shift register or the slow shift register. The mode select circuit comprises a Boolean logic circuit that is operatively coupled to at least one of either the slow shift register or the fast shift register, the Boolean logic circuit having at least one logical input that determine a first portion of at least one of the shift registers to be used and a second portion of at least one of the shift registers to be discarded.

26 Claims, 6 Drawing Sheets

METHOD AND APPARATUS FOR SPLIT SHIFT REGISTER ADDRESSING

FIELD OF THE INVENTION

The invention relates generally to the field of digital imaging, and in particular to addressing techniques employed within solid state image sensors.

BACKGROUND OF THE INVENTION

There are numerous teachings within the prior art of address decoding techniques. These decoding techniques have been employed at least since the advent of digital computers. These decoding techniques are not restricted to digital computers, but are currently employed in many electronic applications. Typically, the prior art has employed some type of combinatorial logic using Boolean logic to address and select circuits.

Charge coupled devices (CCDs) have been extensively used in modern imaging applications. These applications include: camcorder markets; high resolution, still imaging applications; and fast frame rate, diagnostic and inspection applications. CCD sensor performance criteria include quantum efficiency, optical fill factor, dark current, lag, smear, and dynamic range. There are numerous factors that make the usage of CCDs not always desirable. Among these are power consumption, and the requirement of a special fabrication process that is not compatible with industry standard CMOS process. CCD imagers require special drive and signal processing electronics that result in increased system (camera) cost.

An alternative approach to using CCDs for image sensing devices is to use a CMOS based image sensor having photo diodes integrated within CMOS based control circuitry. The CMOS process can then be used to integrate the rest of electronics on the same chip. Early versions of such image sensors had individual image sensing elements connected to passive devices and, hence, were called passive pixel sensors. These prior art passive pixel sensors have evolved by employing active devices, such as a readout amplifier, for every pixel to counter the effect of bus capacitance, resulting in a device that is modernly termed active pixel sensors (APS). More recent developments, such as double delta sampling has increased the signal-to-noise performance of APS image sensors. The APS image sensors are presently considered by numerous applications by corporate institutions because of their low cost and their low power consumption.

Any pixel within an APS image sensor array can be randomly addressed by activation of an X address line in combination with at Y address line. For a 512×512 pixel sensor, 18 wires are needed to address the pixels, thus requiring 18 more pins on the sensor. Additionally, these address lines have dense decoder demands (a 9 input address decoder is required to individually address the 512 pixels on each of the 512 lines of the sensor). Another disadvantage is the allotment of the routing space required for these address lines.

Moreover, the usage of such a high number of 9 input decoder requires substantial silicon. Typically, a 9-input AND gate is required to implement the decoding with the required random addressing capability. Each of these 9-input AND gate normally comprises 20 or more transistors. Thus, a 512 of these 9-input AND gates may need over 10,240 transistors, and this must be implemented in both the X and the Y directions. In addition, to the substantial spatial requirements, such a decoder also increases the power consumption.

The alternative approach is to use a shift register technique to address various pixels on the sensor. The usage of shift registers for addressing the pixels reduces the overall transistor count substantially. However, conventional shift register techniques do not allow for random addressing of the pixels. The readout of such a conventional shift register based systems is analogous to a camcorder, reading pixel after a pixel in every line, and then one line after another until the end of the frame. That approach does not work well for APS devices because it does not possess the random addressing that is a feature of APS devices.

It should be readily apparent from the foregoing discussion that there remains a need within the art for a device employing address decoding techniques that provide the random addressing techniques required for APS imagers with a reduced gate count.

SUMMARY OF THE INVENTION

The present invention is directed to overcoming one or more of the problems set forth above. By providing a fast shift register unit that has 8 shift registers, and using these shift registers to rotate the address for every line time in cycles. A slow shift register unit has 512/8 shift registers, equal to 64. The slow shift register unit shifts after every 8 line period as determined by the fast shift register. This rotates information ones for every 8 lines duration.

Briefly summarized, according to one aspect of the present invention, an addressing circuit comprising:

a fast shift register unit having a predetermined number of shift register locations;

a slow shift register unit having a predetermined number of shift register locations;

a combinatorial circuit having inputs from the fast shift register and the slow shift register; and a timing circuit electrically coupled to each the fast shift register and the slow shift register.

As discussed previously, APS devices require random addressing capability, however, in reality the random addressing required by most applications is limited and only demands a few different types of read out techniques. Therefore, it is possible to devise an apparatus having a predetermined degree of programmability (to yield the necessary amount of random access capability) while employing significantly less silicon than the previously discussed prior art devices. Such a novel idea is presented, herein where, the shift register technique is modified to introduce the requisite programmability by running one of various modes. The preferred embodiment employs one of the following addressing modes either: all lines are read out; 2 lines are read and 2 lines are discarded in a repetitive manner for the entire sensor; or 2 lines are read out and 6 lines are discarded in a repetitive manner for the entire sensor. The above foregoing amount of programmability can be employed without requiring additional address lines by what is referred to, herein, as the split shift register technique.

A row and column addressing architecture is disclosed for an APS sensor wherein all required and usable options can be incorporated with reduced number of cells and silicon area, while eliminating the address lines and thus pins on the sensor. With the use of the disclosed method there will be considerable amount of savings of power dissipation in the sensor. The case is explained with one example and generalized with the appropriate mathematical equations.

These and other aspects, objects, features, and advantages of the present invention will be more clearly understood and appreciated from a review of the following detailed description of the preferred embodiments and appended claims, and by reference to the accompanying drawings.

Advantageous Effect of the Invention

The present invention has the following advantages. A row old column addressing is provided where all required options can be incorporated with reduced number of cells resulting in the usage of less silicon area. This further results in eliminating address lines and pins on the sensor. The technique also results in considerably less power dissipation for the sensor.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

Figure 1:
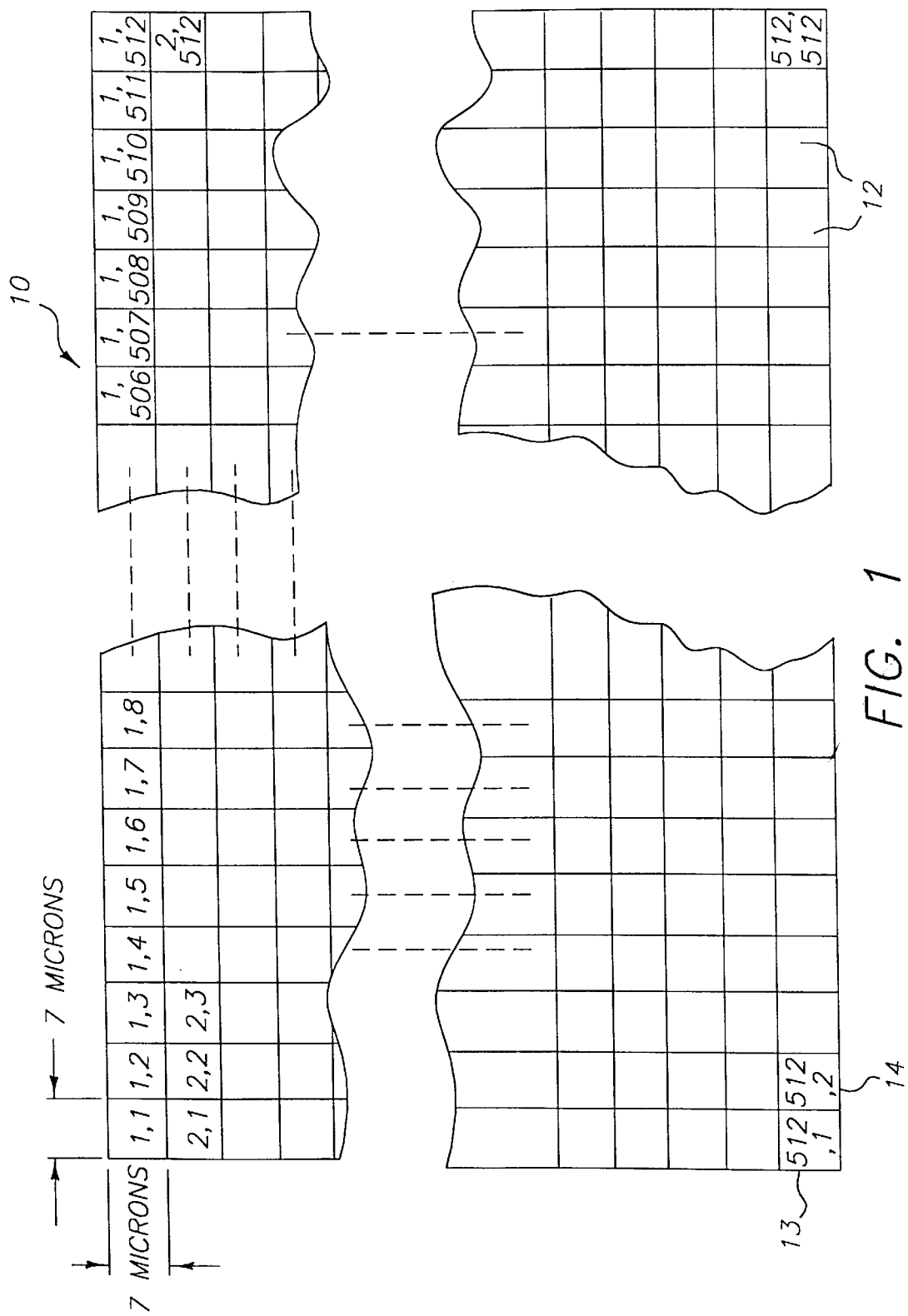
FIG. 1 is an APS sensor outline layout wherein the pixel height is shown.

As shown in FIG. 1, an APS sensor 10 has a matrix of imaging pixels 12 formed in rows 13, and columns 14. The imaging pixels 12 on APS sensor 10 are 7.4 micron square within the preferred embodiment. To preserve sensor real estate, any decoder used by the sensor should fall within this 7.4 micron limit. This places substantial constraints on the decoder design.

Figure 2:
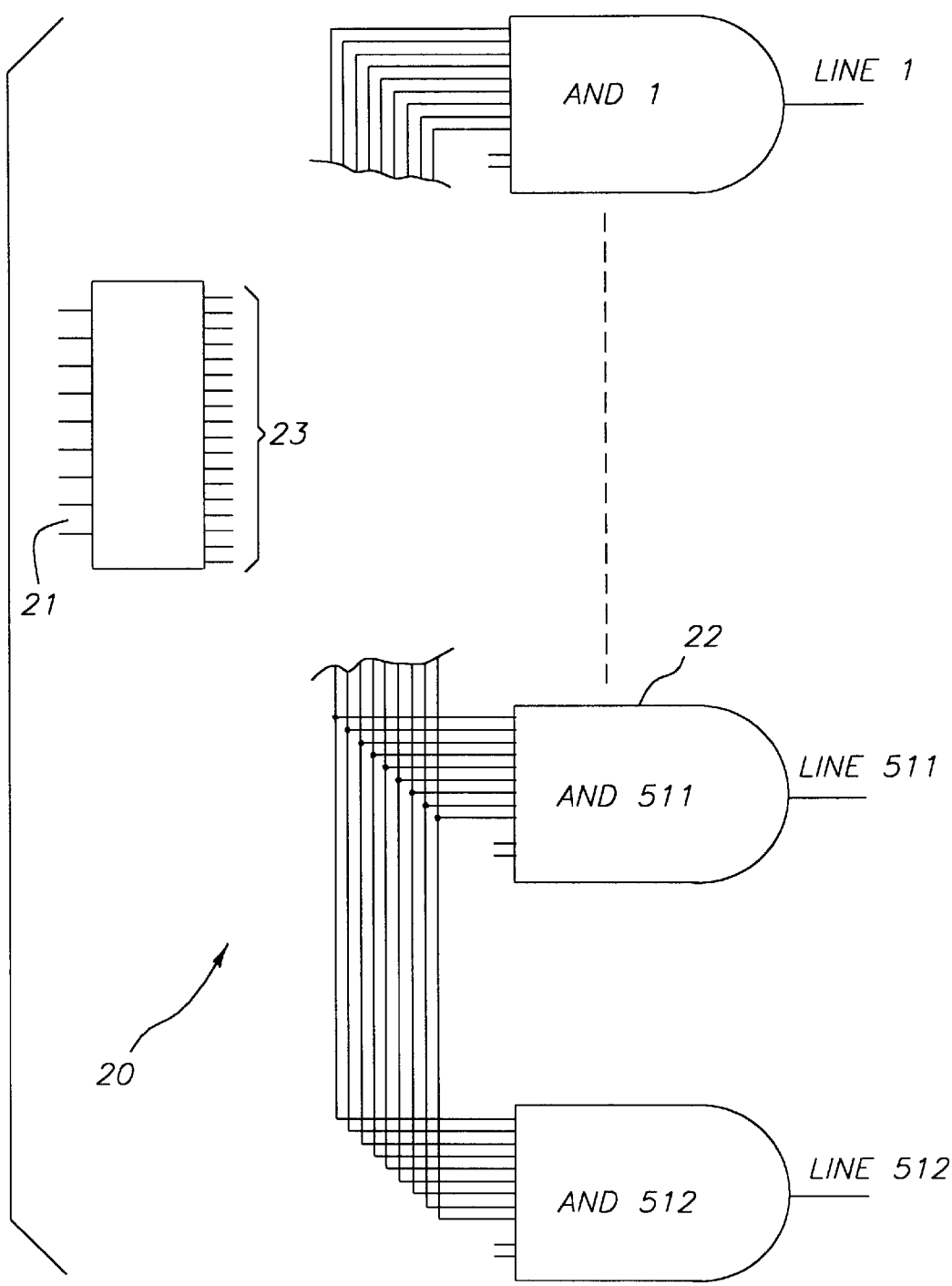
FIG. 2 illustrates a prior art address decoder employing AND gates.

FIG. 2 illustrates a prior art address decoder employing AND gates. To address an image sensor similar to that shown in FIG. 1 having 512 lines, the decoder will require 9 address lines 21 that need to be decoded. As shown in FIG. 2, the 512 row APS sensor requires a 9 bit decoder circuit 20, and 512 9-input AND gates 22. The decoder circuit must make available both inverted and noninverted versions of each of these lines to be provided to AND gates 22 to properly decode these address lines. Essentially, an invertor (not shown) must be provided for each of the lines between the decoder circuit 20 and the AND gates 22. This then requires 18 lines 23 to rout the decoded 9 address lines (9 routing lines logic true and 9 routing lines logic false). The 9-input AND gate 22 structure is a relatively large device to be placed within the same silicon wafer as the image sensor, resulting in an AND gate 22 based decoders that takes more width and in turn more area. In a similar fashion, an image sensor having 1024 rows would require 10 address lines and a 10 bit decoder resulting in 20 actual lines (both logic true and logic false) that need to be routed.

Figure 3:
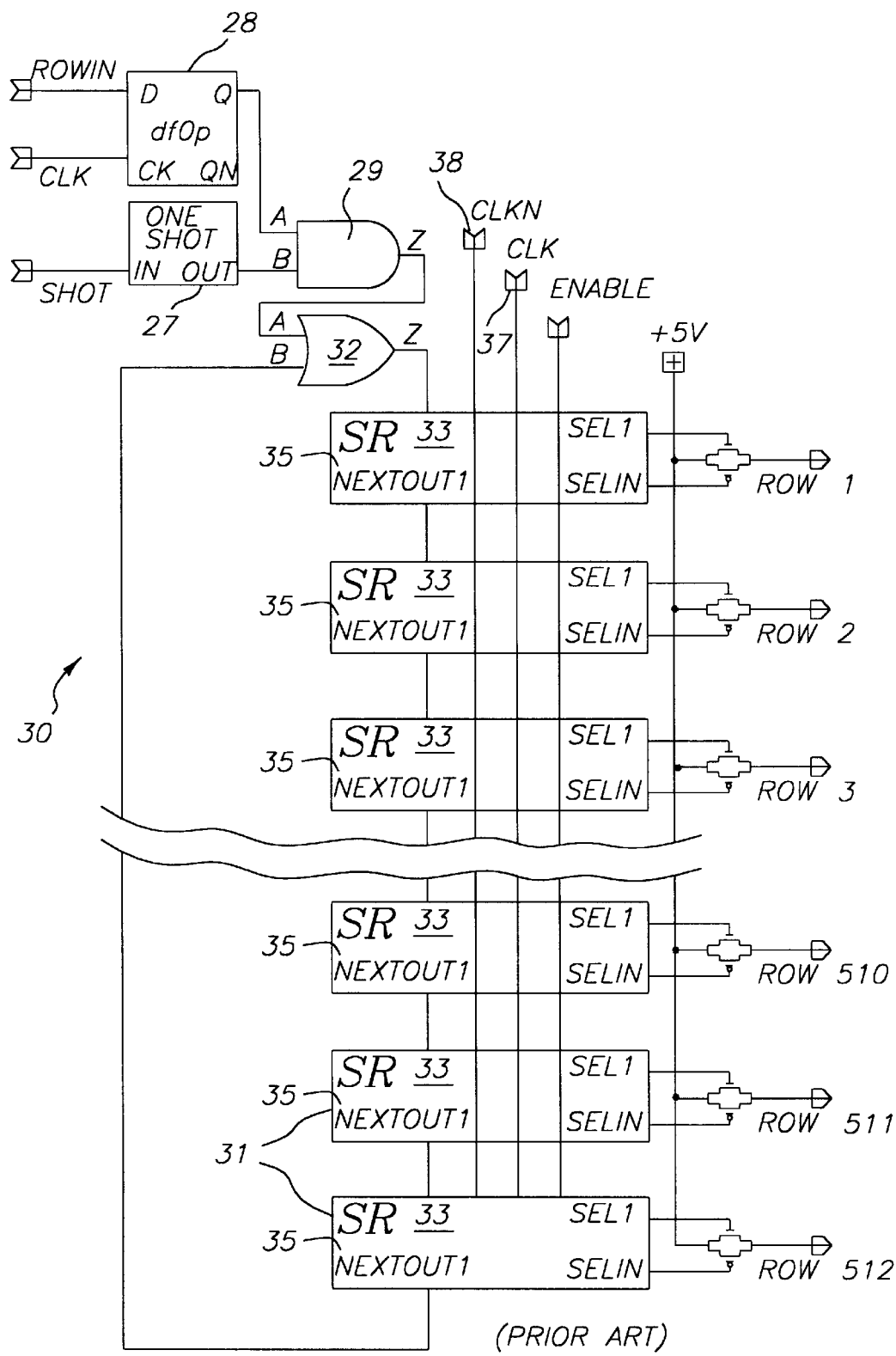
FIG. 3 shows an alternative prior art approach using shift registers for address decoding.

FIG. 3 shows an alternative prior art approach for making a decoder 30 using shift registers 31 for address decoding. The shift register approach, shown in FIG. 3 does not have the random access capability of the decoder 20 shown in FIG. 2, however, the shift register approach requires less silicon area. As evident from FIG. 3, each shift register 31 has an input 33, an output 35 and two clock inputs, a positive clock 37 and a negative clock 38. The output 35 of the 1st block is connected to the input 33 of the 2nd block and output 35 of the 2nd block is connected to the input 33 of the 3rd block and the output 35 of the last block is connected to the 1st block through an OR gate 32. The other input to OR gate 32 is a synchronized version of the output from ONE SHOT 27 that is synchronized by AND Gate 29 that provides a combinational version from DQ flip flop 28 and the output of ONE SHOT 27.

Still referring to FIG. 3, the principle of shift register is to pass the present state of the nth register to the (n+1)th register at the instance of clock signal. Thus, when one period signal is given to the input 33 of 1st shift register 31 through the OR gate 32, that signal will appear at the output 35 of the 1st shift register at the 1st clock cycle, while all other shift registers outputs remain a logical low. At the occurrence of 2nd clock signal the output 35 of 1st shift register is transferred to the output 35 of the 2nd shift register and so on. Thus, an active high appears on 2nd shift register and all other shift registers are active low. It is evident from the diagram that the active high appears only at the output of one shift register only at any instant of time. Thus, after repeating 512 shift registers the active high then appears on the 1st shift register. This is very effective design for addressing rows or columns if the sensor is clocked out only one mode of operation by clocking out whole image sequentially. However, this design lacks the limited random accessibility which is desirable for camera design.

Figure 4A:
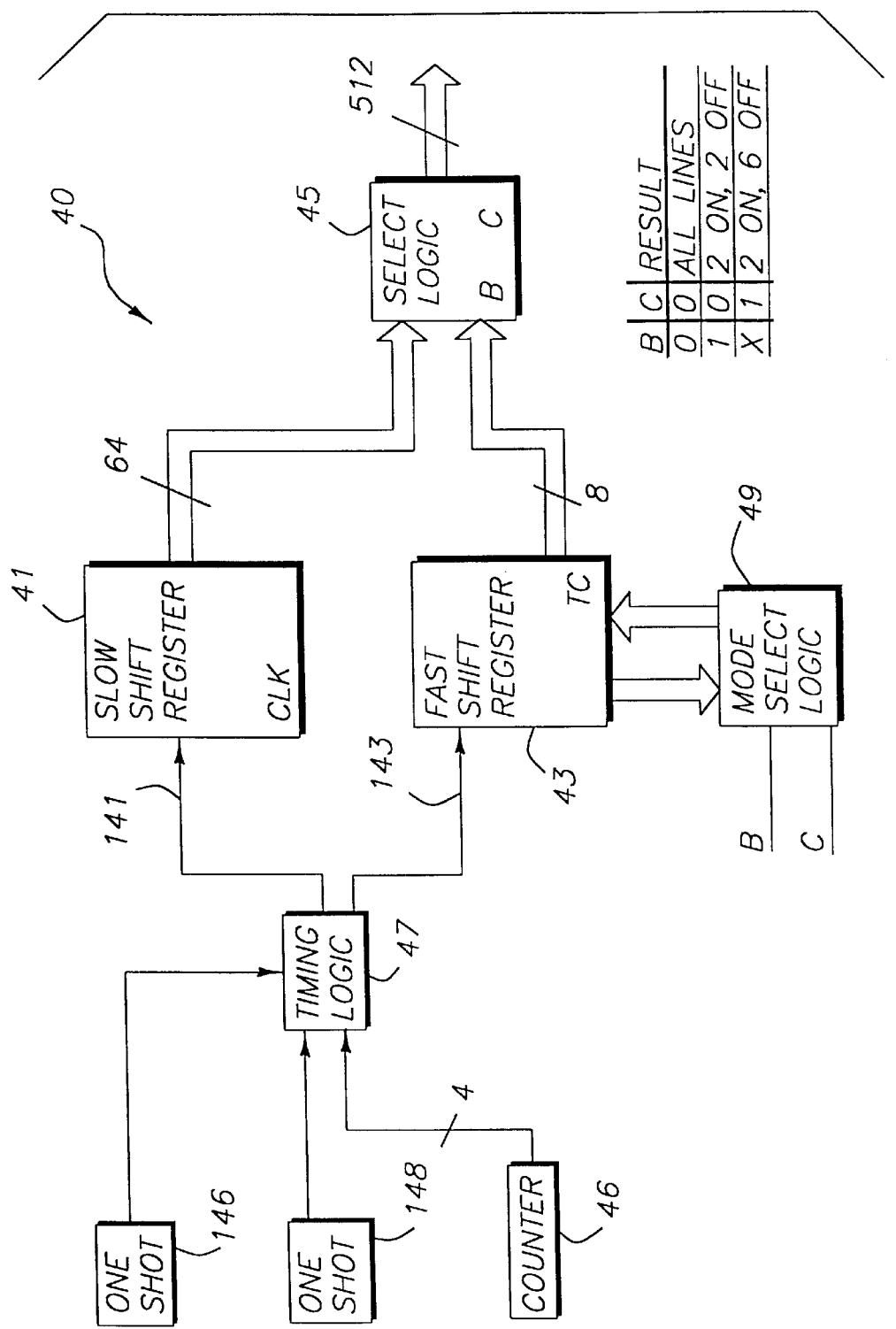
FIG. 4A show a block diagram for the split shift register technique.

FIG. 4A is a block diagram illustrating the split shift register design 40 for address decoding as envisioned by the present invention. This design incorporates the flexibility of limited programmability needed within modern camera designs to access the desired modes of operation, and provides the reduced gate count required for integration within the image sensing element. These parameters of providing a reduced gate count, reduced pin numbers, and a reduced level of power dissipated by the device are satisfied by the design shown in FIG. 4A.

Still referring to FIG. 4A, timing logic 47 is used to provide the combinational logic that takes pulses generated from ONE SHOTs 146, 148 and synchronizes them with clocked outputs from counter 46 to initiate the addressing sequence after a Power On Reset (POR). Timing logic 47 provides Boolean combinations from counter 46 and each of the ONE SHOTs 146, 148 to generate the initial input signals 141, 143 to both the slow and fast shift register units 41, 43. This results in the initial shift position for each of the shift register units 41, 43 being set to a logic "1".

The fast shift register unit 43 in the preferred embodiment provides 8 shift register locations that are used to select 8 lines, in sequential order. The logic "1" in the first shift position of the fast shift register unit 43 will cycle through all 8 shift locations bits with the output of each shift location being provided to the select logic 45 for selecting a line. Once the entire series of eight lines has sequenced, then a clock signal is sent to the timing logic 47 which generates a clock signal 141 to the slow shift register unit 41. The slow shift register unit 41 will then shift the logic "1" from it's initial shift location to the second shift location. Slow shift register unit 41 has 64 individual shift locations in the preferred embodiment. For each of the 64 positions within the slow shift register unit 41, the fast shift register unit 43 will cycle through all 8 locations. This yields a total of 64*8=512 potential line selections capable of individually selecting each of the 512 rows of a 512×512 image sensor with a total of 72 shift register locations. It will be appreciated by those persons skilled in the art that instead of splitting the shift register units 41, 43 into units having, respectively 64 and 8 shift placements, a division of 16 and 32 shift placements could also be employed to address the 512 lines. The specific split within the shift register units illustrated, herein, is the preferred embodiment, in which considerations such as routing interconnect layers have been taken into consideration as well as the total number of shift register elements employed. The same basic concept can then be applied to address each of the 512 columns on an individual basis to provide separate addressing of individual pixels.

The timing logic 47, as shown in FIG. 4A, is used to implement synchronous pulses at desired times to the slow and fast shift register units 41, 43. In the preferred embodiment ONE SHOTS 146, 148 are used in conjunction with counter 46. ONE SHOTS 146, 148 are monostable multivibrators which can be configured to yield pulses of varying lengths. During start frame periods or during power up periods, the generation of a pulse having the duration of at least one line is made by one shot 146. This is done only during power up or start frame periods. ONE SHOT 148 is also pulsed one time during periods of start frame or power up for at least a time period of 8 lines. These pulses from one shots 146, 148 are logically combined with outputs from counter 46. The counter 46 is reset during power up and start frame periods so that the outputs are a logic "0". The logical combination that results is that both slow shift register unit 41 and fast shift register unit 43 have initial shift position set to a logical "1" on the next clock cycle. The use of one shots 146, 148 in conjunction with counter 46 provides a means of providing a synchronous signal for given time periods to the slow and fast shift register units 41, 43.

The decoder envisioned has three modes of operation. They are a) all lines to be clocked out, b) use two lines and throw away 2 lines, and c) use two lines and throw away 6 lines. By applying logic inputs B and C to the select logic 45 from the mode select 49, the select logic provides these functions as discussed below.

As previously discussed the shift register units 41, 43 are split into two parts, one part having 8 shift locations and the other part having 64 shift locations. The 3 modes of operation are provided with the additional of a few logic gates to the select logic 45. The outputs from select shift register locations from the fast shift register unit 43 are gated with logic inputs B and C to select the desired mode. The truth table seen in FIG. 4A illustrates the function resulting from the B and C inputs.

Figure 4B:
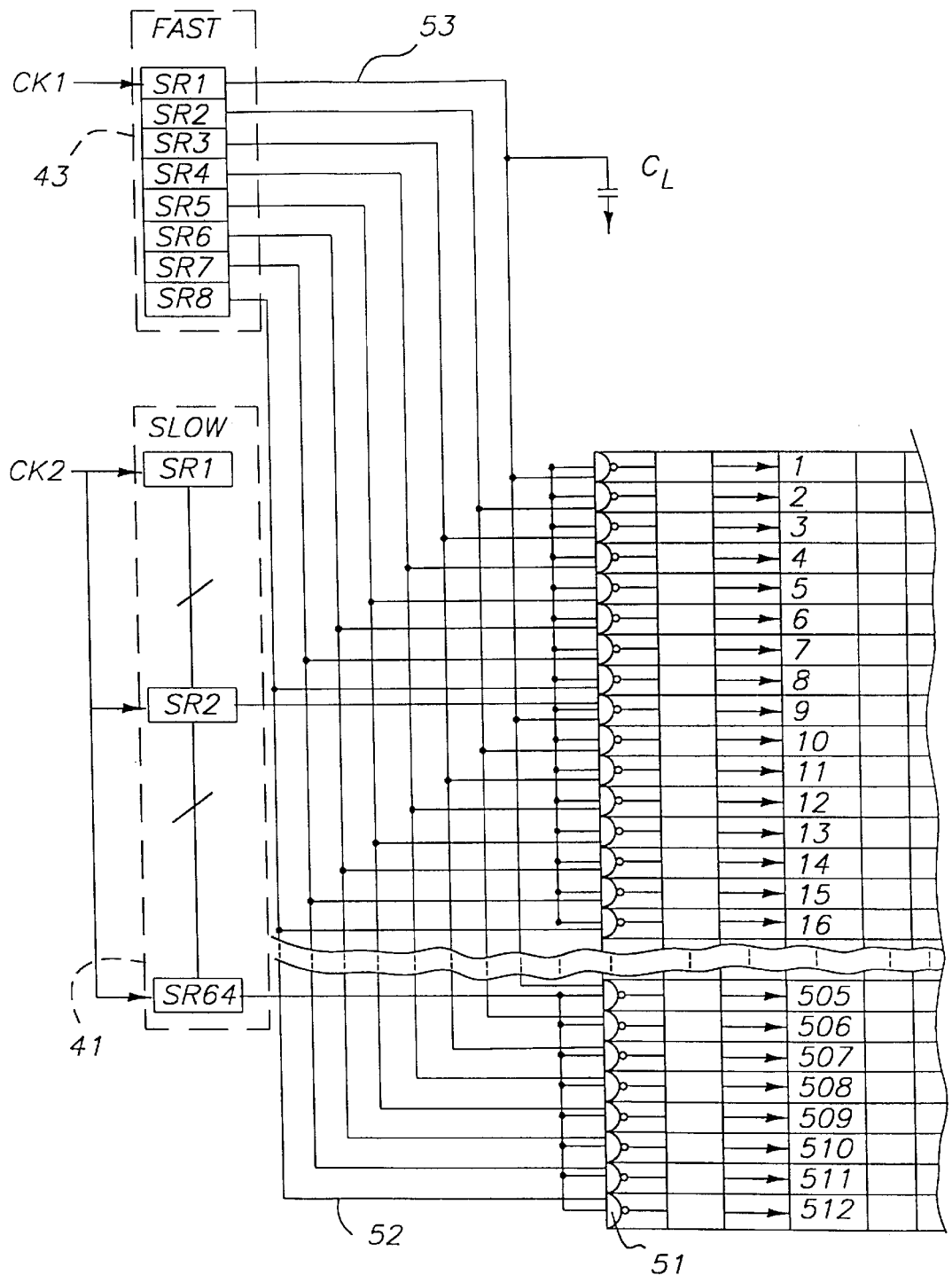
FIG. 4B illustrates a detailed block diagram for the preferred embodiment of the split shift register technique of the present invention.

Referring to FIG. 4B, the 8 shift register locations from fast shift register unit 43 are individually gated with each of the 64 locations from the slow shift register unit 41. In the preferred embodiment the gates used are AND gates 51 with the outputs 52 of all 64 locations of the slow shift register unit 41 being individually ANDed with the outputs 53 for the 8 locations from the fast shift register unit 43, thus, providing address selection for all 512 lines.

Figure 5:
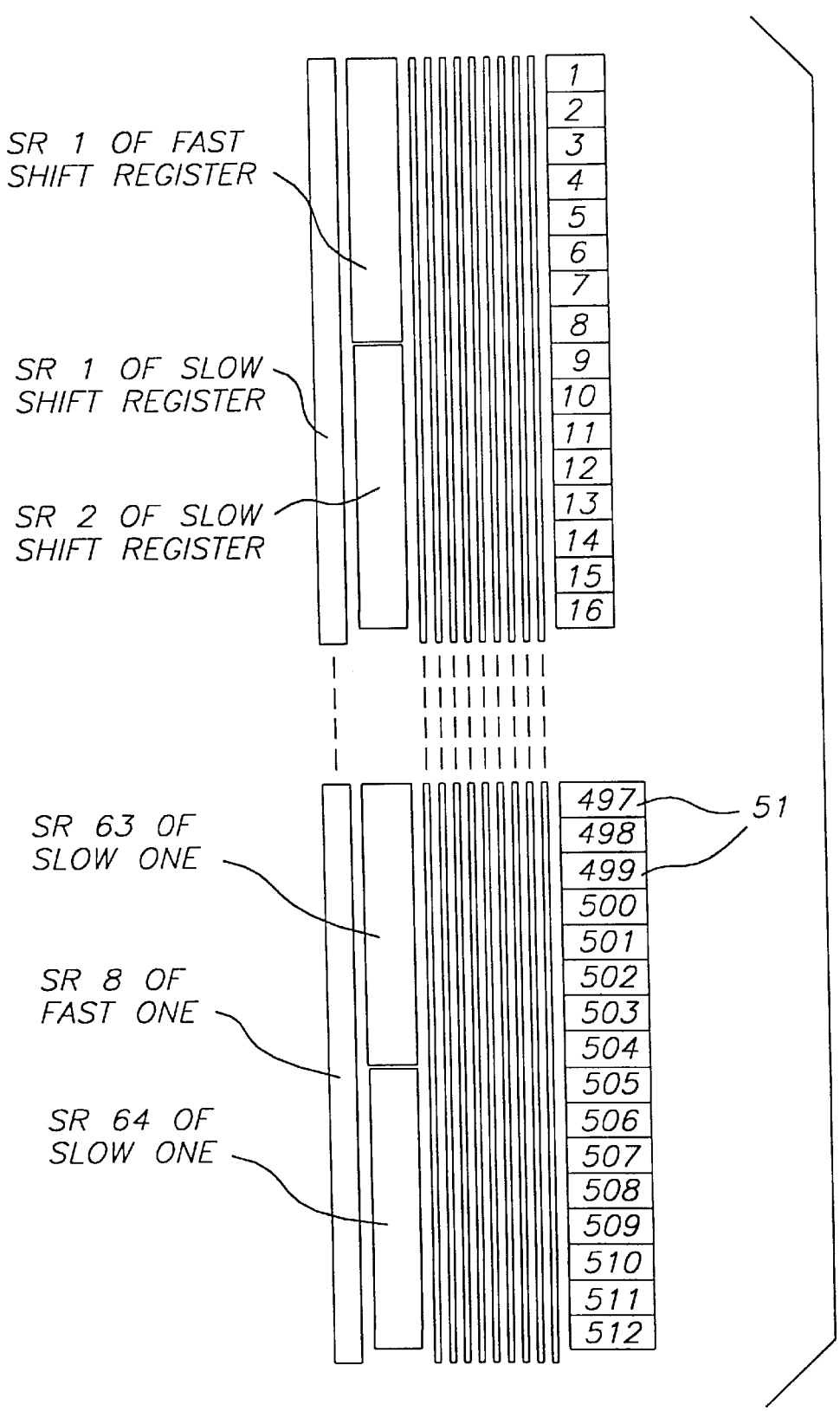
FIG. 5 illustrates the global routing as envisioned by the present invention.

The reduced routing methodology is shown in FIG. 5. The outputs from the slow shift register unit 41 and the fast shift register unit 43 need to be ANDed together in a series of 2-input AND gates. These a 2-input AND gates are made the pixel height which is 7.4 microns. These are shown with number 1 through 512 in FIG. 5. The outputs of the 8 shift locations for the fast shift register unit 43 are routed vertically beside these gates. Slow shift register unit 41 has outputs (that are to be logically combined with the outputs from the fast shift register unit 43) positioned such that the initial shift position of the slow shift register unit 41 runs near the outputs for Line1–Line8. By having the outputs of the slow shift register unit 41 available for only the vicinity of 8 AND gates the height and width of these structures are reduced by being placed beside the necessary routing lines. The output of each of the bits within the slow shift register 41 run for only 8 AND gates height. Thus a total of 9 wires are routed throughout the pixel height. The fast shift register unit 41 with its associated controlling logic can be placed such that they will also occupy a height of 8 bits of the slow shift registers unit 43. Thus a compact design is made with this invention.

The present invention will not increase the silicon area if the sensor resolution is varied. The decoder method shown in FIG. 2 provides programmable resolution features, however, changes in the gating results with the change in sensor resolution. For example a 258×258 pixel sensor needs 8 input AND gates as the decoder, where as a 512×512 pixel sensor needs 9 input AND gates as the decoder.

The invention has been described with reference to a preferred embodiment; However, it will be appreciated that variations and modifications can be effected by a person of ordinary skill in the art without departing from the scope of the invention.

Parts List

10 APS sensor
12 pixels
13 rows
14 columns
20 decoder
21 address lines
22 AND gates
23 lines
27 ONE SHOT
28 flip flop
29 AND Gate
30 decoder
31 shift registers
32 OR gate
33 input
35 output
37 positive clock
38 negative clock
40 split shift register design
41 slow shift register
43 fast shift register
45 select logic
46 counter
47 timing logic
49 mode select
51 AND gates
52 outputs
53 outputs
141 input signal
143 input signal
146 ONE SHOT
148 One SHOT

What is claimed is:

1. An addressing circuit for addressing a two dimensional array comprising:
   a first shift register circuit formed for addressing the array in a first direction and a second shift register circuit formed for addressing the array in a second direction;
   wherein, each of the shift register circuits further comprise a split registers design having a fast shift register unit having a first predetermined number of shift registers that are coupled to a slow shift register unit having a second predetermined number of shift registers by a combinatorial circuit having inputs from the fast shift register unit and the slow shift register unit; and a timing circuit electrically coupled to each the fast shift register unit and the slow shift register unit.

2. The addressing circuit of claim 1 further comprising a mode select circuit that is operatively coupled to at least one of either the fast shift register unit or the slow shift register unit.

3. The addressing circuit of claim 2 wherein the mode select circuit further comprises a Boolean logic circuit that is operatively coupled to at least one of either the slow shift register unit or the fast shift register unit, the Boolean logic circuit having at least one logical input that determine a first portion of at least one of the shift register units to be used and a second portion of at least one of the shift register units to be discarded.

4. The addressing circuit of claim 1 wherein the timing circuit further comprises at least a single one shot.

5. The addressing circuit of claim 1 wherein the timing circuit further comprises at least one counter.

6. The addressing circuit of claim 1 further comprising a second combinatorial circuit interfacing the timing circuit to the slow and fast shift register units.

7. The addressing circuit of claim 1 wherein the fast shift register unit is configured with the combinatorial circuit to shift through each shifting element before the slow shift register unit shifts through one shifting element.

8. The addressing circuit of claim 2 wherein the mode select circuit is placed at the fast shift register unit.

9. The addressing circuit of claim 8 wherein the size of the fast shift register unit is equal to the least common multiple of modes of operation created by the mode select circuit.

10. The addressing circuit of claim 1 further comprising an image sensor having a matrix of pixels arranged in a plurality of rows and columns, and the addressing circuit performs either row or column addressing.

11. The addressing circuit of claim 10 further comprising a second addressing circuit such that there is one addressing circuit for row addressing and the second addressing circuit for column addressing.

12. The addressing circuit of claim 10 wherein the fast shift register unit and the slow shift register unit each have a size that is selected to minimize length and number of routing lines used to connect the addressing circuit together.

13. The addressing circuit of claim 10 wherein the slow shift register unit has eight times the number of shift register elements that the fast shift has.

14. A method of addressing circuits arranged in an array of rows and columns comprising the steps of:

providing a horizontal shift register circuit formed for addressing the rows and a vertical shift register circuit formed or addressing the columns;

wherein, each of the shift register circuits further comprise a split registers design having a fast shift register unit having a first predetermined number of shifting elements that is operatively coupled to a slow shift register unit having a second predetermined number of shifting element by a combinatorial circuit having inputs from the fast shift register unit and the slow shift register unit, and a timing circuit electrically coupled to each the fast shift register and the slow shift register;

employing outputs from the fast shift register unit and the slow shift register unit to select a predetermined addressable unit.

15. The method of addressing of claim 14 wherein the step of employing further comprises employing a mode select circuit operatively coupled to at least one of either the fast shift register unit or the slow shift register unit.

16. The method of addressing of claim 15 wherein the step of employing the mode select circuit further comprises employing the mode select circuit to select a sequence by which the circuit is addressed.

17. The method of addressing defined by the steps of claim 15 wherein the providing step further comprises providing the fast shift register unit such that it has a size equal to the least common multiple of modes of operation created by the mode select circuit.

18. The method of addressing claim 14 wherein the providing step further comprises at least a single one shot as the timing circuit.

19. The addressing circuit of claim 14 wherein the timing circuit further comprises at least one counter.

20. The method of addressing defined by claim 14 wherein the providing step further comprises providing a combinatorial circuit interfacing the timing circuit to the slow and fast shift register units.

21. The method of addressing defined by claim 14 further comprising wherein the fast shift register unit is configured with the combinatorial circuit to shift through each of its shifting elements prior the slow shift register unit shifting one if its shifting elements.

22. An imaging device arranged in an array of rows and columns comprising:

a horizontal shift register circuit formed for addressing the rows and a vertical shift register circuit formed or addressing the columns;

wherein, each of the shift register circuits further comprise a split registers design having a fast shift register unit having a first predetermined number of shifting elements coupled to a slow shift register unit having a second predetermined number of shifting elements by a combinatorial circuit having inputs from the fast shift register unit and the slow shift register unit;

a timing circuit electrically coupled to each the fast shift register unit and the slow shift register unit;

means for applying outputs from the fast and slow shift register units to the imaging device.

23. The addressing circuit of claim 22 further comprising a mode select circuit that is operatively coupled to at least one of either the fast shift register units or the slow shift register units.

24. The addressing circuit of claim 23 wherein the mode select circuit further comprises a Boolean logic circuit that is operatively coupled to at least one of either the slow shift register unit or the fast shift register unit, the Boolean logic circuit having at least one logical input that determine a first portion of at least one of the shift registers to be used and a second portion of at least one of the shift registers to be discarded.

25. The addressing circuit of claim 22 wherein the timing circuit further comprises at least one synchronized one shot pulse used to provide an initial input to either the fast or slow shift register unit.

26. The addressing circuit of claim 22 wherein the timing circuit further comprises at least one synchronized one shot pulse, the one shot pulse being synchronized by a Boolean combination with a counter output.

* * * * *